United States Patent
Peters et al.

(10) Patent No.: US 7,998,823 B2
(45) Date of Patent: Aug. 16, 2011

(54) METHOD FOR REDUCING LEAKAGE CURRENTS CAUSED BY MISALIGNMENT OF A CONTACT STRUCTURE BY INCREASING AN ERROR TOLERANCE OF THE CONTACT PATTERNING PROCESS

(75) Inventors: Carsten Peters, Dresden (DE); Kai Frohberg, Niederau (DE); Ralf Richter, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 702 days.

(21) Appl. No.: 11/533,793

(22) Filed: Sep. 21, 2006

(65) Prior Publication Data
US 2007/0161225 A1    Jul. 12, 2007

(30) Foreign Application Priority Data

Dec. 30, 2005  (DE) .......................... 10 2005 063 131

(51) Int. Cl.
*H01L 21/336* (2006.01)
(52) U.S. Cl. ........ 438/307; 438/233; 438/306; 438/561; 438/563; 257/E21.443; 257/E21.551; 257/E21.556; 257/E21.557
(58) Field of Classification Search .................. 438/217, 438/289, 174, 224, 290, 291, 298, 233, 306, 438/307, 545, 561, 563; 257/E21.443, E21.51, 257/E21.556, E21.557, E21.558, E21.551
See application file for complete search history.

(56) References Cited

U.S. PATENT DOCUMENTS

| | | | | |
|---|---|---|---|---|
| 5,904,531 A | * | 5/1999 | Liaw | 438/296 |
| 5,930,633 A | * | 7/1999 | Liaw | 438/296 |
| 5,966,614 A | * | 10/1999 | Park et al. | 438/401 |
| 5,977,600 A | * | 11/1999 | Wristers et al. | 257/408 |
| 6,018,180 A | | 1/2000 | Cheek et al. | 257/344 |
| 6,133,105 A | * | 10/2000 | Chen et al. | 438/296 |
| 6,238,967 B1 | * | 5/2001 | Shiho et al. | 438/244 |
| 6,258,680 B1 | * | 7/2001 | Fulford et al. | 438/305 |
| 6,358,803 B1 | * | 3/2002 | Michael et al. | 438/301 |
| 6,645,867 B2 | * | 11/2003 | Dokumaci et al. | 438/700 |
| 6,710,413 B2 | * | 3/2004 | Thei et al. | 257/382 |
| 6,764,908 B1 | * | 7/2004 | Kadosh et al. | 438/285 |
| 6,962,862 B2 | | 11/2005 | Kumamoto | 438/595 |
| 7,109,094 B2 | * | 9/2006 | Chang et al. | 438/434 |
| 2005/0045956 A1 | | 3/2005 | Chen et al. | 257/355 |

OTHER PUBLICATIONS

Ghandhi, S.K., VLSI Fabrication Principles, Silicon and Gallium Arsenide, 1983 by John Wiley and Sons Inc., pp. 517-519.*
Translation of Official Communication from German Patent Office for German Patent Application No. 10 2005 063 131.2 dated Jun. 16, 2010.

* cited by examiner

*Primary Examiner* — Julio J Maldonado
(74) *Attorney, Agent, or Firm* — Williams, Morgan & Amerson, P.C.

(57) ABSTRACT

By forming an additional doped region with increased junction depth at areas in which contact regions may connect to drain and source regions, any contact irregularities may be embedded into the additional doped region, thereby reducing the risk for leakage currents or short circuits between the drain and source region and the well region that may be conventionally caused by the contact irregularity. Moreover, additionally or alternatively, the surface topography of the semiconductor region and the adjacent isolation trench may be modified prior to the formation of metal silicide regions and contact plugs to enhance the lithography procedure for forming respective contact openings in an interlayer dielectric material. For this purpose, the isolation trench may be brought to an equal or higher level compared to the adjacent semiconductor region.

26 Claims, 6 Drawing Sheets

METHOD FOR REDUCING LEAKAGE CURRENTS CAUSED BY MISALIGNMENT OF A CONTACT STRUCTURE BY INCREASING AN ERROR TOLERANCE OF THE CONTACT PATTERNING PROCESS

BACKGROUND OF THE INVENTION

1. Field of the Invention

The present invention relates to the field of semiconductor manufacturing, and, more particularly, to the formation of an interconnect structure having contact plugs for connecting to contact regions of circuit elements, such as drain/source regions of a transistor.

2. Description of the Related Art

Semiconductor devices, such as advanced integrated circuits, typically contain a huge number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines that provide the inner-level electrical connection, and also include a plurality of inter-level connections, which are also referred to as "vias," that are filled with an appropriate metal and provide the electrical connection between two neighboring stacked metallization layers.

For establishing the connection of the circuit elements with the metallization layers, an appropriate vertical contact structure is provided that connects to a respective contact region of a circuit element, such as a gate electrode and the drain/source regions of transistors, and to a respective metal line in the first metallization layer. The contact plugs and regions of the contact structure are formed in an interlayer dielectric material that encloses and passivates the circuit elements.

During the formation of the respective contact plugs and regions, corresponding contact openings are formed in an interlayer dielectric material and these contact openings are subsequently filled with an appropriate material, such as a barrier material and tungsten or any other appropriate material. The formation of the contact openings is based on a photolithography step, during which the respective contact openings have to be aligned to respective contact regions of the circuit elements under question, such as source and drain regions of a transistor element, wherein, during the corresponding alignment procedure, slight misalignments may occur such that the corresponding contact opening may connect to undesired areas, such as an interface between an isolation trench and the active region, thereby resulting in a high risk for forming unwanted leakage current paths. In order to more clearly demonstrate the problems involved in the formation of contact plugs for circuit elements, such as transistor elements, an illustrative example of a conventional process technique will now be described with reference to FIG. 1.

FIG. 1 schematically shows a cross-sectional view of a conventional semiconductor device 100 comprising a substrate 101, above which is formed a circuit element 120 and an interconnect structure 130. The circuit element 120 may comprise an active semiconductor region or well region 103, which may be formed in an appropriate semiconductor layer 102, such as a silicon layer, wherein the active region 103 may be bordered by an isolation trench 112, which may be filled with any appropriate insulating material, such as silicon dioxide. Moreover, the circuit element 120 may comprise doped regions 104 and 104e within the active region 103, which may represent drain and source regions, wherein a dopant concentration in the regions 104 and 104e forms a PN junction, in combination with a corresponding inverse dopant concentration within the remaining semiconductor region 103, which may also be referred to body region. As is well known, a PN junction as formed by the doped regions 104, 104e, in combination with the well region 103, may be essential for the functioning of transistor elements, as well as for other circuit elements, such as conductive lines, capacitors, resistors and the like, as a conductive connection between the well region 103 and the doped regions 104, 104e is established upon application of appropriate electrical fields, while, otherwise, current flow, at least in one direction, may be substantially suppressed except for minor leakage currents.

Moreover, the circuit element 120, when represented by an illustrative transistor element, may comprise a gate electrode 105 formed above the region 103 that may be separated therefrom by a gate insulation layer 106. Typically, sidewall spacers 107 may be formed on sidewalls of the gate electrode 105, depending on device and process requirements.

The interconnect structure 130 may be comprised of an interlayer dielectric material 109 that is formed above the substrate 101 so as to surround the circuit element 120, wherein a contact etch stop layer 108 may be formed between the circuit element 120 and the interlayer dielectric material 109. Furthermore, the interconnect structure 130 comprises a contact region or contact plug 110 that is filled with a highly conductive material, such as tungsten, possibly in combination with a barrier material (not shown), so as to provide a highly conductive electric connection to a contact region of the circuit element 120, such as the drain and source region 104 and the gate electrode 105, which may comprise highly conductive metal silicide regions 113.

A typical process flow for forming the semiconductor device 100 as shown in FIG. 1 may comprise the following processes. After the formation of the circuit element 120 on the basis of well-established process techniques involving advanced photolithography, sophisticated deposition and etch techniques, advanced implantation processes, anneal sequences and advanced metal silicide formation techniques, the contact etch stop layer 108 may be formed above the circuit element 120 including the isolation trench 112 by well-established plasma enhanced chemical vapor deposition (PECVD) techniques. Thereafter, the interlayer dielectric material 109 may be deposited on the basis of, for instance, TEOS, oxygen and ozone in accordance with well-established chemical vapor deposition (CVD) techniques, wherein, optionally, the resulting layer 109 may be planarized by chemical mechanical polishing (CMP).

Next, an advanced lithography process may be performed, during which a contact pattern is transferred from a photolithography mask into a corresponding resist layer formed above the interlayer dielectric material 109, wherein the pattern of the lithography mask has to be aligned to the substrate 101 to position the contact plug 110 at an appropriate area within the circuit element 120 to establish the required electrical connection in an appropriate manner. Typically, the alignment process is very critical and a certain amount of misalignment has to be tolerated due to unavoidable insufficiencies or inaccuracies during the lithography process. Consequently, during a subsequent anisotropic etch process for forming a respective contact opening in the interlayer dielectric material 109 and subsequently in the contact etch stop layer 108, the contact opening may "land" on undesired circuit areas, such as the isolation trench 112, wherein the associated etch process may lead to irregularities within the respective contact opening, which may finally result after the filling of the contact opening with a conductive material to form the contact plug 110, in respective metal protrusions or irregularities 111. Depending on the process specifics, these protrusions 111 may even extend, in many cases, into the well region 103, thereby providing a direct contact from the contact plug 110 to the well region 103 by bridging the respective PN junction defined by the drain and source region 104 and the well region 103. In other cases, the corresponding metal protrusions 111 may provide increased leakage current paths, thereby also negatively affecting the operation of the circuit element 120. Consequently, due to substantially non-avoidable insufficiencies of the corresponding photolithography process, reduced performance or even failure of the corresponding circuit element 120 may result after the formation of the respective interconnect structure 130. However, increasing the area of the circuit element 120 that is available for receiving the contact plug 110 may be a less desirable option due to a significant increased amount of chip area which would be necessary in this case.

Thus, in view of the situation described above, a need exists for a more efficient technique for the formation of an interconnect structure while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that significantly increases the error tolerance during the formation of an interconnect structure, substantially without unduly affecting other device characteristics. In order to reduce the probability for the formation of contact irregularities, which, in conventional devices, may lead to increased leakage currents or electrical short circuits, the depth of a PN junction may be significantly increased, at least within an area in which a contact plug is to be formed, and/or by reducing the height of an active semiconductor region relative to the adjacent isolation trench, thereby significantly enhancing the performance of a corresponding alignment process during lithographical definition of respective contact openings. Consequently, additional floor space in the die for providing increased process tolerances, as is the case in some conventional techniques, may not be substantially consumed and hence the present invention is highly advantageous in combination with advanced semiconductor devices requiring extremely scaled circuit dimensions.

According to one illustrative embodiment of the present invention, a method comprises forming source and drain regions adjacent to a gate electrode, wherein the gate electrode is located above a semiconductor region that is bordered by an isolation trench. The drain and source regions define a first PN junction with a channel region and a second PN junction with a well region of the semiconductor region, wherein the first PN junction defines a first junction depth and the second PN junction defines a second junction depth within a central area of the semiconductor region. The method further comprises forming a third PN junction at least around a contact region, wherein the third PN junction has a third junction depth at the isolation trench. The third junction depth is greater than the first and second junction depths.

According to another illustrative embodiment of the present invention, a method comprises forming an isolation trench in a semiconductor layer that is formed above a substrate. The method further comprises forming a circuit element in a semiconductor region which is bordered by the isolation trench. Finally, a relative increased height of a portion of the semiconductor region that is located adjacent to the isolation trench is reduced with respect to the isolation trench.

According to yet another illustrative embodiment, a semiconductor device comprises an isolation trench formed in a semiconductor layer, wherein the isolation trench defines an active semiconductor region having formed therein a drain and a source region. The drain and source regions define a first PN junction with a channel region and a second PN junction with a well region of the semiconductor region. The first PN junction defines a first junction depth and the second PN junction defines a second junction depth within a central area of the semiconductor region. Moreover, a third PN junction having a third junction depth is provided at the isolation trench, wherein the first and second junction depths are less than the third junction depth. Furthermore, the semiconductor device comprises an interlayer dielectric material formed above the active semiconductor region and a contact region formed in the interlayer dielectric material, wherein the contact region is filled with a conductive material to electrically connect to the active semiconductor region and wherein the contact region is located above an area of the drain and source regions having the third junction depth.

BRIEF DESCRIPTION OF THE DRAWINGS

The invention may be understood by reference to the following description taken in conjunction with the accompanying drawings, in which like reference numerals identify like elements, and in which.

Figure 1:
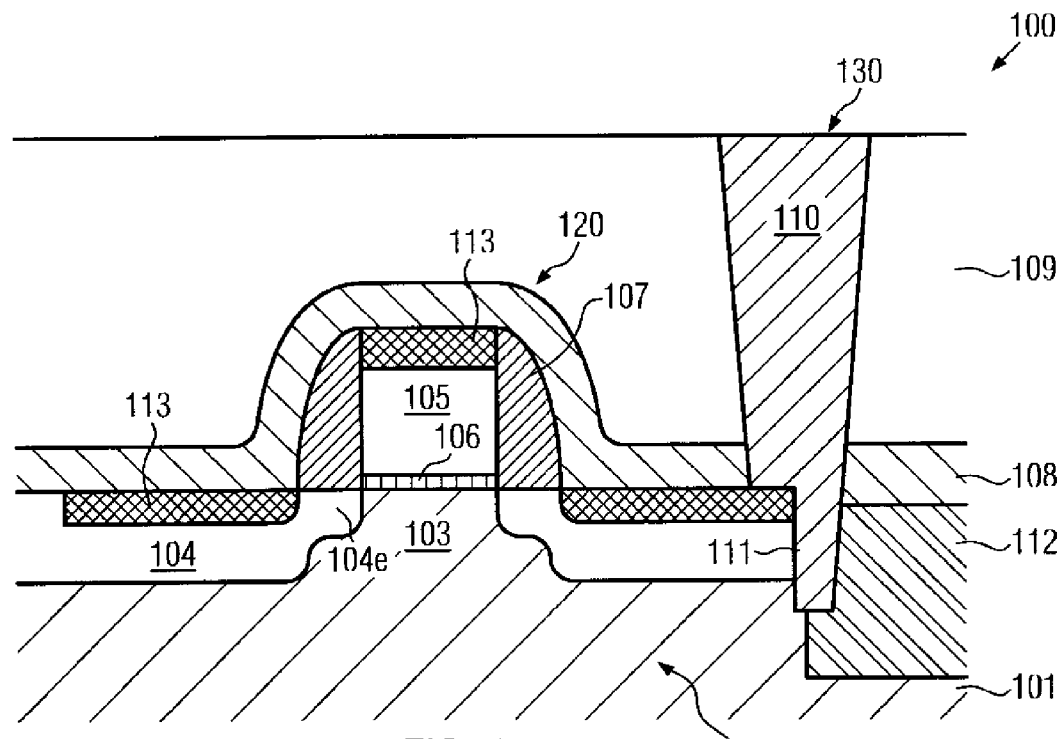
FIG. 1 schematically illustrates in a cross-sectional view a conventional semiconductor device including a circuit element and a contact plug connected thereto, wherein contact irregularities may result in an increased leakage current according to conventional process techniques.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention addresses the problem of increased leakage current paths or short circuits created during the formation of contact plugs connecting to active semiconductor regions, i.e., to semiconductor regions having a high dopant concentration so as to form a PN junction with respect to an inversely doped well region, wherein the active semiconductor region may be bordered by an isolation trench. The interface between the active semiconductor region and the isolation trench may be prone to increased device failure due to the formation of metal-containing protrusions, which may extend far into the active semiconductor region and even beyond the PN junction, thereby shorting the well region and the drain and source regions. In some cases, the alignment accuracy of the lithography process may be significantly enhanced by compensating for or reducing the height difference between the active semiconductor region and the adjacent isolation trench. It has been recognized that an increased height of the active semiconductor region with respect to the adjacent isolation trench may result in a reduced alignment precision during the lithography process, tending to place the respective contact opening above the interface between the semiconductor region and the isolation trench. The present invention therefore contemplates significantly reducing the relative height difference or even providing an increased height at the side of the isolation trench, thereby providing the potential for an enhanced positioning performance which may result in a significantly reduced formation of deleterious contact irregularities. In other illustrative embodiments of the present invention, additionally or alternatively to the former approach, the junction depth of the active semiconductor region in the vicinity of the isolation trench, at least within an area at which it is expected that a respective contact may be formed, is significantly increased, thereby reducing the risk for creating a leakage path or a short circuit after the filling in of a conductive material into the respective contact opening. Consequently, even if corresponding highly conductive contact irregularities may be formed during the contact formation process, the effects of such an irregularity may be significantly reduced by "embedding" the irregularity into the drain and source regions so that, even for otherwise very shallow drain and source regions, the probability for leakage currents and short circuits may be reduced. In some illustrative embodiments disclosed herein, the enhanced surface topography provided by the technique for adapting the relative height difference between the active semiconductor region and the isolation trench is combined with the increased junction depth at the vicinity of the isolation trench, and an even more pronounced reduction of corresponding contact irregularities and their influence on the device performance may be achieved. The present invention is highly advantageous in the context of highly scaled semiconductor devices requiring extremely scaled device dimensions in combination with shallow PN junctions, without requiring any additional floor space within a respective semiconductor substrate.

Figure 2A:
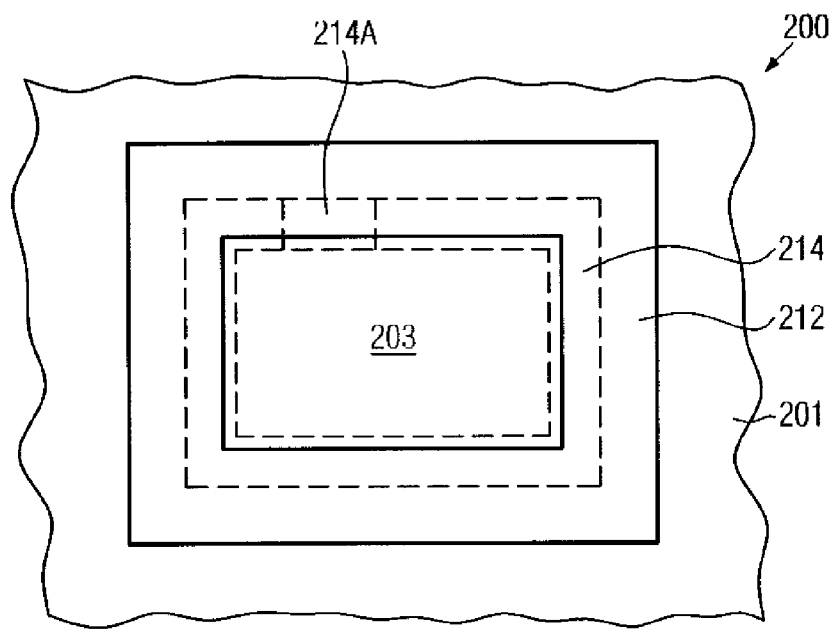
FIG. 2a schematically shows a top view of an active semiconductor region bordered by an isolation trench with an area of increased junction depth according to illustrative embodiments of the present invention.

With reference to FIGS. 2a-2h and 3a-3g, further illustrative embodiments of the present invention will now be described in more detail. FIG. 2a schematically illustrates a top view of a semiconductor device 200, in which a substrate 201 may comprise an appropriate semiconductor layer (not shown) in which may be formed an isolation trench 212 bordering a respective well region 203, i.e., a doped semiconductor region, in which is to be formed an inversely doped semiconductor region or active region, which may also be referred to as a drain and/or source region, wherein it should be appreciated that the corresponding drain/source region may not necessarily act as a drain or source of a respective field effect transistor. For example, the drain/source region formed in the corresponding well region 203 may act as a current path for any appropriate circuit elements, wherein the dopant concentration and profile within the respective drain/source region is established on the basis of process techniques and process recipes that are used for commonly forming respective source and drain regions for actual transistor elements. Irrespective of whether the respective drain/source region acts as a transistor drain or source, respective PN junctions are formed in combination with the well region 203 which have a diode characteristic that may be essential for the proper functioning of certain circuit elements.

Moreover, in FIG. 2a, a region 214 is illustrated in which a dopant is introduced down to a depth that exceeds the depth of any PN junctions that are to be formed or that are already formed in the region 203. In other illustrative embodiments, the region 214 may have formed therein a respective dopant concentration down to a desired increased depth at dedicated areas, in which a contact plug is to be formed. For example, a portion 214A of the region 214 may represent an area of the semiconductor device 200 in which a contact plug is to be formed, wherein the portion 214A may represent an area including maximum misalignment tolerances that may occur during a corresponding manufacturing process. That is, the position and the size of the portion 214A may be selected such that a target position for a contact plug to be formed is centered within the portion 214A, while the size of the portion 214A also takes into consideration any allowable misalignment tolerances so that a corresponding contact plug will definitely land within the portion 214A as long as the device 200 meets the respective process specifications. Providing the dopant profile with increased junction depth within the portion 214A may be advantageous in highly advanced applications, since, in all other areas of the well region 203, the remaining dopant profile and concentration of respective drain/source regions may remain substantially unaffected. Consequently, any shallow dopant profiles to be formed in the region 203 may be substantially preserved, while nevertheless a significantly increased junction depth may be provided within the portion 214A to reduce any risk for creating leakage paths or short circuits during the subsequent formation of contact plugs. The region 214 or the portion 214A may be formed at any appropriate manufacturing stage, which may include any stage prior to the formation of the isolation trench 212 up to any point in the manufacturing sequence in which respective contact openings are already formed. Furthermore, the dopant species required for the formation of the portion 214A or the region 214 having the increased junction depth may be introduced by diffusion and ion implantation as will be described in more detail with reference to FIGS. 2b-2h.

Figure 2B:
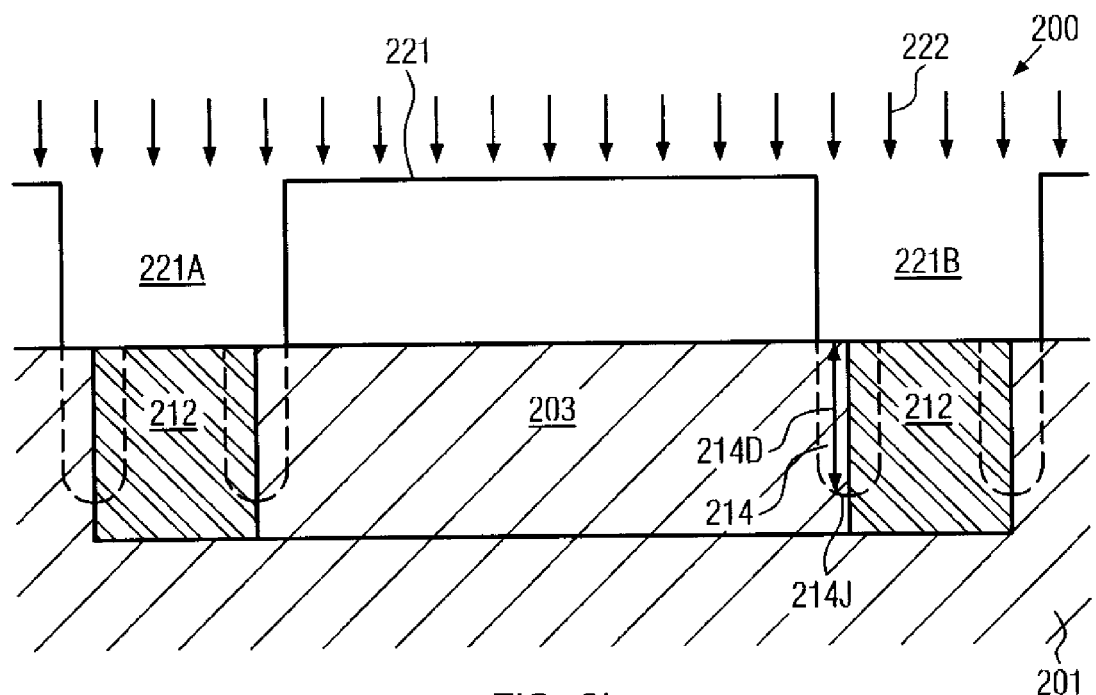
FIGS. 2b-2h schematically show cross-sectional views of a semiconductor device during various manufacturing stages in forming a doped region having an increased junction depth with respect to a standard drain and source region in accordance with other illustrative embodiments of the present invention.

FIG. 2b schematically illustrates a cross-sectional view of the semiconductor device 200 at an early manufacturing stage in accordance with illustrative embodiments of the present invention. In FIG. 2b, the semiconductor device 200 comprises the substrate 201 having formed therein the isolation trench 212, which encloses the semiconductor region or well region 203. Moreover, in this manufacturing stage, the device 200 may be covered by an implantation mask 221, which may be comprised of photoresist or any other appropriate material. The implantation mask 221 may comprise one or more respective openings 221A so as to expose a desired portion of the device 200 corresponding to the region 214 or at least the portion 214A as shown in FIG. 2a.

The device 200 is further subjected to an ion implantation process 222 to introduce an appropriate dopant species for forming the region 214 or the portion 214A. For example, the ion species used during the implantation sequence 222 is selected such that an appropriate PN junction 214J may be defined in combination with the doping of the well region 203. That is, for a P-doped well region 203, a corresponding N-type dopant may be introduced by means of the ion implantation process 222, wherein a vertical dopant profile may be selected such that a corresponding increased depth 214D compared to a design depth of regular drain/source regions may be defined by the respective PN junction 214J formed between the region 214 and the well region 203. It should be appreciated, however, that, depending on device and process specifics, the position and thus the depth 214D of the respective PN junction 214J may be defined more or less precisely, wherein, however, the location of the depth of the PN junction 214J may at any rate be identified with an accuracy that may enable identifying a difference relative to a depth of a PN junction formed by a standard drain and source region that is still to be formed in the well region 203. Furthermore, the corresponding target value for the junction depth 214D may be selected to "cover" a wide class of contact irregularities, i.e., corresponding penetration depths of protrusions, such as the protrusions 111 shown in FIG. 1. Appropriate data may be obtained from failure analysis of defective devices and the like.

A typical process flow for forming the device 200 as shown in FIG. 2b may comprise the following processes. After the formation of the isolation trench 212 on the basis of well-established photolithography, anisotropic etch, deposition and planarization techniques, a vertical dopant profile within the well region 203 may be created by respective implantation sequences. It should be appreciated that a corresponding vertical dopant profile in the well region 203, which is for convenience not shown in FIG. 2b, may be established such that a decreasing dopant concentration from bottom to top, a so-called retrograde profile, may be obtained. Respective implantation recipes are well-established in the art. Thereafter, the mask 221 may be formed, for instance in the form of a resist mask, wherein a corresponding lithography may provide the respective openings 221A. Thereafter, the ion implantation process 222 may be performed on the basis of appropriately selected process parameters, such as dose and energy, in order to position the PN junction 214J at the required depth 214D. It should be appreciated that appropriate process parameters may be readily obtained on the basis of experience, test runs, simulation calculations or any combination thereof for any desired ion species.

In other illustrative embodiments, the mask 221 may be comprised of materials other than photoresist, for instance the mask 221 may be comprised of gate electrode material including, for instance, a respective gate insulation layer, which may be "pre-patterned" to receive the openings 221A. After the ion implantation process 222, the mask 221 may then be further patterned by well-established recipes to form a gate electrode structure above the well region 203.

In still other illustrative embodiments, the mask 221 may be formed from any other appropriate material, such as silicon dioxide, silicon nitride and the like, for which well-established deposition and etch regimes are available so as to appropriately form, pattern and remove the mask layer 221. Thereafter, the further processing of the device 200 may be continued on the basis of well-established recipes, including the removal of the mask layer 221, followed by, for instance, the deposition of a gate electrode material, when the mask 221 is formed from a different material, followed by respective photolithography and anisotropic etch techniques for forming a gate electrode structure. Thereafter, respective implantation processes may be performed to define actual drain and source regions within the well region 203.

Figure 2C:
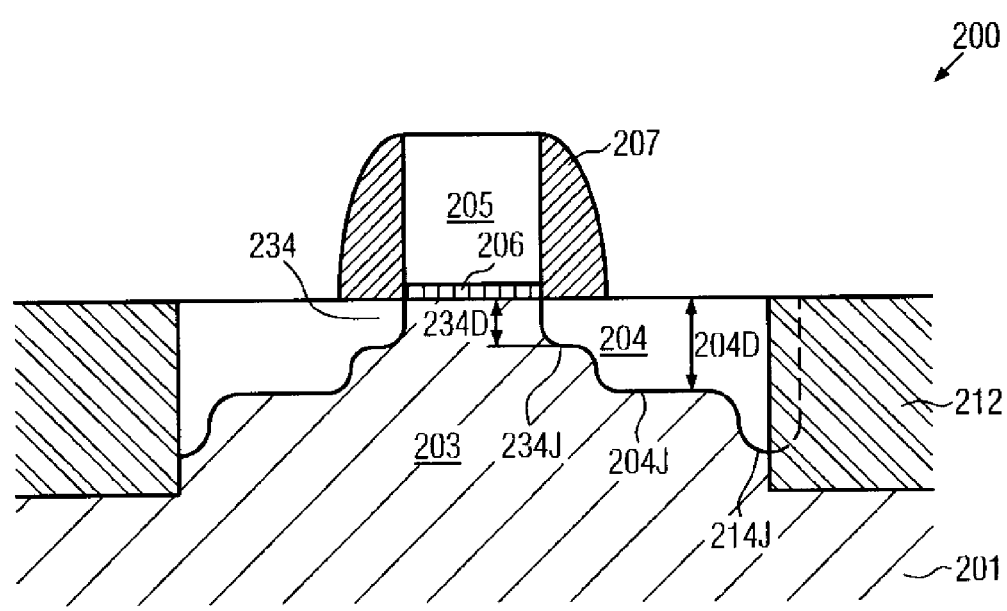

FIG. 2c schematically shows the semiconductor device 200 in a further advanced manufacturing stage after the completion of some of the above-described manufacturing processes. In FIG. 2c, the device 200 comprises a gate electrode 205 formed above the well region 203 and separated therefrom by a gate insulation layer 206. Moreover, sidewall spacers 207 may be formed adjacent to sidewalls of the gate electrode 205. Furthermore, drain and source regions 204 including respective extension regions 234 may be formed adjacent to the gate electrode 205, wherein the drain and source region 204 connects to the region of increased junction depth 214. As is evident from FIG. 2c, the extension regions 234 form a corresponding PN junction with the well region 203, indicated as 234J, wherein a maximum depth 234D may be less than a corresponding depth 204D of a PN junction 204J of the deep drain and source region 204. As previously explained, in sophisticated applications, the depth 204D of the drain and source region 204 may be in the range of several nanometers, as typically, for reduced gate lengths of 100 nm and significantly less, a reduced depth of the respective junctions 234J and 204J is also required. By providing the significantly increased depth 214D, at least in the vicinity of the isolation trench 212, any adverse effects of contact irregularities, especially at the interface between the trench isolation 212 and the region 214, may be significantly reduced. In some illustrative embodiments, the increased depth 214D may be provided only at the portion 214A (FIG. 2a), thereby only slightly affecting the shallow PN junctions 204J at areas that are located outside the portion 214A.

The device 200 as shown in FIG. 2c may be formed on the basis of well-established recipes including the implantation of an appropriate dopant species, wherein the spacer structure 207 may be used as an implantation mask for laterally profiling the dopant distribution in order to form the regions 234 and 204. Thereafter, any appropriate anneal sequence may be performed in order to substantially cure implantation-induced damage and activate the dopants, wherein the dopant species forming the region 214 may also be activated and a corresponding lattice damage may be cured. It should be appreciated, however, that typically the region 214 has minor influence on the overall performance of the device 200 and hence forming the region 214 at a later stage, which may not allow a corresponding high temperature anneal process, may nevertheless provide the desired effect of suppressing or preventing undesired leakage currents or short circuits. Thus, the region 214 may be formed at any desired point in the manufacturing sequence, irrespective of whether any high temperature anneal process may be allowed at this manufacturing stage. Thereafter, the further processing may be continued on the basis of well-established recipes, as is for instance also described with reference to FIG. 1, wherein especially any contact irregularities, such as the protrusion 111, may be efficiently compensated for on the basis of the region 214.

Figure 2D:
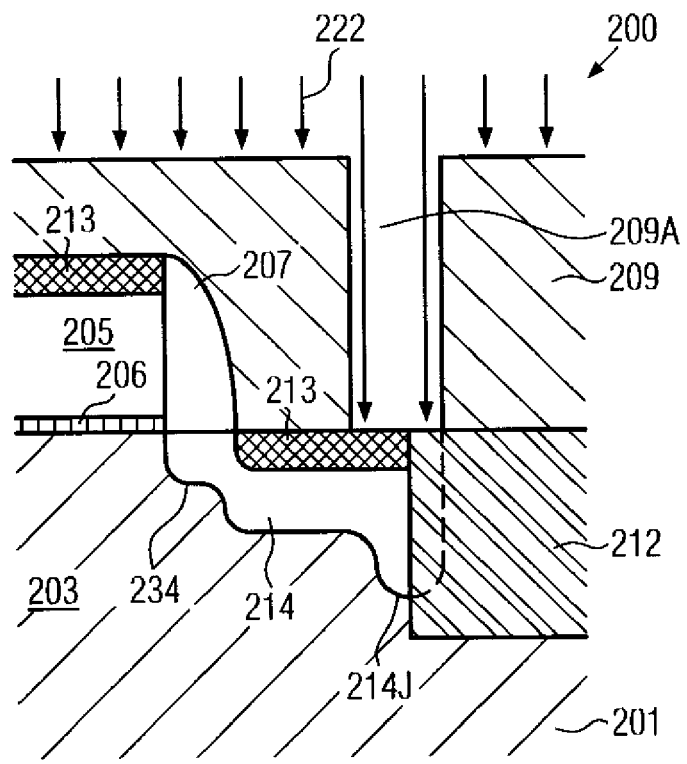

FIG. 2d schematically shows the semiconductor device 200 in accordance with still further illustrative embodiments of the present invention in which the doped region 214 is formed at a later manufacturing stage. In this example, the doped region 214 having the increased junction depth 214D may be formed after the completion of the circuit element 220, for instance the transistor device as shown in FIG. 2c, wherein the mask layer 221 may be formed after the completion of the circuit element 220 by means of an appropriate lithography process similarly to that described with reference to FIG. 2b. In this manufacturing stage, the circuit element 220 may have respective highly conductive contact regions 213, which may be comprised of a metal silicide, as is typically employed in sophisticated semiconductor devices. The region 214 may be formed by the ion implantation 222 in substantially the same fashion as is previously described. Consequently, the mask 221 may also be formed to substantially expose the entire region 214 (FIG. 2a) or the portion 214A, which substantially corresponds to an area for receiving respective contact openings including any allowable process tolerances. As previously explained, due to the provision of temperature sensitive areas in the circuit element 220, such as the metal silicide regions 213, a high temperature anneal process may not be performed after the ion implantation process 222, wherein nevertheless an operational PN junction may be obtained so as to significantly reduce any leakage currents or short circuits.

Figure 2E:
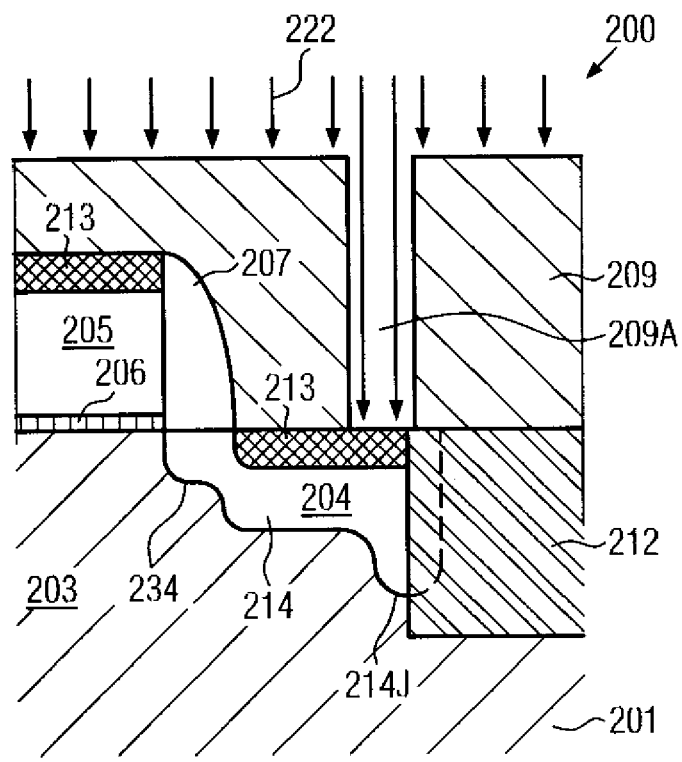

FIG. 2e schematically shows the semiconductor device 200 in a further advanced manufacturing stage according to still other illustrative embodiments, in which an interlayer dielectric material 209 is formed above the circuit element 220 and the isolation trench 212, wherein a respective contact etch stop layer 208 may also be provided between the interlayer dielectric material 209 and the circuit element 220 and the isolation trench 212. Furthermore, a contact opening 209A may be formed in the interlayer dielectric material 209 and in the contact etch stop layer 208, wherein, as previously explained, a slight misalignment may have occurred during the formation of the contact opening 209A, thereby positioning the contact opening also above unwanted regions, such as the isolation trench 212. Consequently, prior to filling the contact opening 209A with an appropriate conductive material, the ion implantation process 222 may be performed at this stage, wherein the patterned interlayer dielectric material 209 and the contact etch stop layer 208 may be used as an implantation mask so as to form the region 214, which is now "self-aligned" to a respective contact to be formed in the opening 209A. Consequently, the region 214 is formed only in those portions of the well region 203 or the drain and source region 204 in which the probability for forming respective contact irregularities such as the protrusions 111 actually exists.

In some illustrative embodiments, respective implantation parameters, such as dose and energy, may be selected so as to obtain the predefined depth of the junction 214J with a concentration that allows a reliable formation of the PN junction, while on the other hand a significant impact on other device areas may be significantly suppressed. For example, the probability for the formation of contact irregularities may essentially be encountered in the context of N-channel transistors while P-channel transistors, due to an increased surface area, may be substantially not affected by this issue. Therefore, an appropriate N-dopant may be implanted by the process 222 on the basis of appropriately selected dose and energy parameter values to provide the region 214 in the N-channel transistors, while substantially not negatively affecting a corresponding source and drain region in the P-channel transistor, in that a moderately low concentration for the region 214 is selected. Consequently, the drain/source region of the P-channel transistor may still be kept operational while the depth of the drain/source region in the N-channel transistor is increased to the depth 214D. In still other embodiments, a corresponding resist mask may be formed prior to the implantation 222 to expose the N-channel transistors while covering the P-channel transistors. Thus, in the embodiments described with reference to FIG. 2e, an advanced lithography process may not be necessary due to the self-aligned technique based on the patterned interlayer dielectric material 209, wherein, in some illustrative embodiments, additionally, a less critical lithography step may be performed, when a high degree of integrity of one type of transistor is required during the implantation 222.

After the implantation 222, the further manufacturing process may be continued similarly as is described with reference to the device 100 illustrated in FIG. 1, wherein, due to the provision of the region 214, any contact irregularities may not negatively influence the overall performance of the circuit element 220 or may have at least only significantly reduced effect.

Figure 2F:
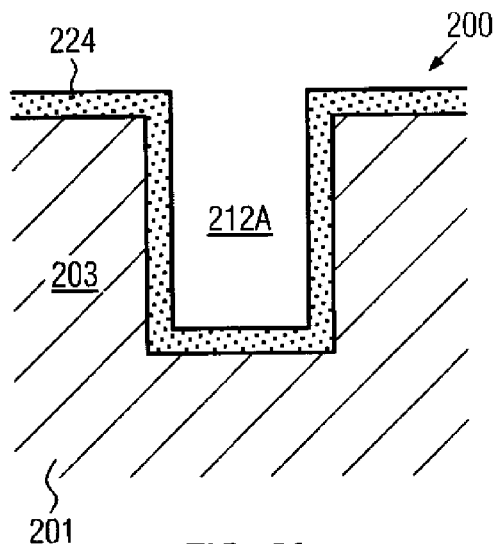
Figure 2G:
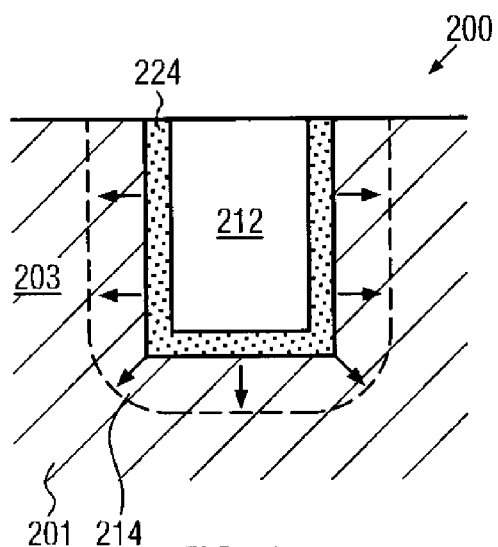
Figure 2H:
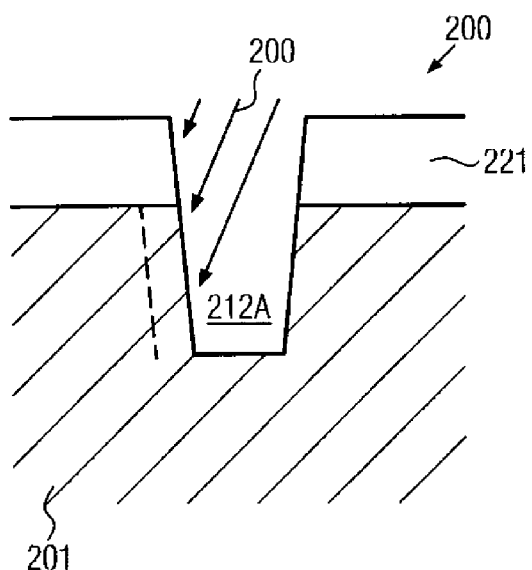

With reference to FIGS. 2f-2h, further illustrative embodiments of the present invention will now be described, wherein the formation of the region 214 may be combined with a manufacturing sequence for forming the isolation trench 212. FIG. 2f schematically shows the semiconductor device 200 in an early manufacturing stage, in which a trench opening 212A is formed within the substrate 201 to define the well region 203 within the substrate 201. Moreover, a highly doped material layer 224, such as a polysilicon layer, a silicon dioxide layer, a silicon nitride layer, or any other appropriate material layer, may be formed above the substrate 201 and within the trench opening 212A. For example, the layer 224 may comprise a high concentration of a specific dopant species, such as an N-dopant species, which may be subsequently driven into adjacent areas by a heat treatment. The layer 224 may be formed after the completion of well-established photolithography and trench etch processes for forming the trench opening 212A, in which is to be formed the isolation trench 212. Thereafter, the layer 224 may be deposited on the basis of any established deposition technique, such as CVD, wherein an appropriate dopant species may be incorporated into the deposition ambient to provide the high desired dopant concentration in the layer 224. In other illustrative embodiments, the layer 224 may be formed by an oxidation process and the dopant species may be incorporated by an appropriate plasma treatment and the like. Thereafter, a heat treatment may be performed to initiate a diffusion of the dopant species into adjacent silicon areas. In other embodiments, when a diffusion from horizontal portions of the layer 224 into lower-lying silicon areas is not desired, the further processing may be continued by filling the trench 212A and subsequently removing any excess material together with horizontal portions of the layer 224. In still other illustrative embodiments, an anisotropic etch process may be performed in order to remove the layer 224 from horizontal device portions, thereby leaving sidewall spacers (not shown) at sidewalls of the trench opening 212A. Thereafter, a heat treatment may be performed and the manufacturing process may be continued by filling the trench opening 212A on the basis of well-established recipes. In still other embodiments, after driving the dopant species into adjacent silicon areas on the basis of the layer 224 or any sidewall spacers formed thereof, the residue of the layer 224, or the layer 224, may be removed and subsequently the conventional process for forming the isolation trench 212 may be continued.

FIG. 2g schematically shows the semiconductor device 200 after filling the trench opening 212A and performing a high temperature treatment to form the region 214, wherein it should be appreciated that, depending on the previously selected process sequence, the region 214 may also be formed below the region 212 when a bottom portion of the layer 224 has not been removed by a previous anisotropic etch process. Thereafter, the further manufacturing process for forming the circuit element 220 may be performed on the basis of any appropriate process strategy, as is for instance described with reference to FIG. 1. As a result, by combining the formation of the region 214 with the trench manufacturing process, a self-aligned procedure is provided wherein any further process complexity associated with the formation by a lithography process and an associated ion implantation may be substantially avoided.

FIG. 2h schematically illustrates the semiconductor device 200 after the completion of a trench etch process for forming the trench opening 212A within the substrate 201. During this process, a corresponding resist mask or any other trench etch mask 221 may be provided. After the completion of the trench etch process, the mask 221 may not be removed and the ion implantation process 222 may be performed on the basis of the mask 221, wherein, depending on the slope of sidewalls of the trench opening 212A, a corresponding penetration of the ion species may be achieved. Moreover, the implantation process 222 may be performed with a specific tilt angle with respect to a direction perpendicular to the substrate 201 in the range of approximately 1-10 degrees, depending on the height of the mask 221 and the width of the trench opening 212A, to enhance the penetration efficiency of the process 222. Thereafter, the mask 221 may be removed and the further processing may be continued as is, for instance, described with reference to FIG. 1 for completing the circuit element 220 to be formed adjacent to the trench opening 212A. Using the etch mask 221 for the ion implantation 222 provides a highly efficient manufacturing sequence, while at the same time a self-aligned procedure for the formation of the region 214 is obtained.

With reference to FIGS. 3a-3g, further illustrative embodiments will now be described in which the topography of the semiconductor device prior to the manufacturing of a contact region is improved in order to enhance the performance of a respective lithography process. It should be appreciated that these further illustrative embodiments may be advantageously combined with any of the embodiments described so far in which the additional doped region 214 is formed to efficiently compensate for any contact irregularities.

Figure 3A:
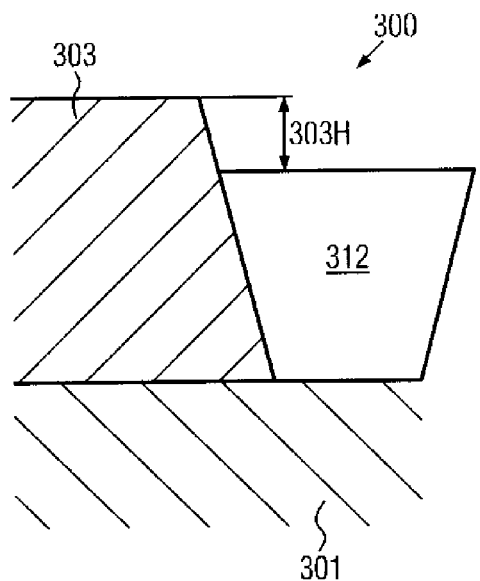
FIGS. 3a-3g schematically illustrate cross-sectional views of a semiconductor device during various manufacturing stages, in which a height difference between an active semiconductor region and an isolation trench is compensated for in accordance with still other illustrative embodiments of the present invention.

FIG. 3a schematically illustrates a semiconductor device 300 comprising a substrate 301 in or above which is formed a semiconductor region 303 that is bordered by an isolation trench 312. The semiconductor region 303 may represent a combination of the well region and a respective drain and source region, such as the regions 203 and 204 as previously described with reference to FIGS. 2a-2h. Moreover, the corresponding criteria previously discussed in the context with the substrate 201 and the isolation trench 212 may also apply for the respective components 312 and 301. As explained above, in some illustrative embodiments, the semiconductor region 303 may have formed therein an additional doped region connecting to a respective drain and source region but having an increased junction depth, as is previously discussed. In still other embodiments, a respective region of increased junction depth, thereby advantageously combining the effect obtained by the additional region 214 with the improved surface topography, may still be formed or a corresponding region may be omitted. The device 300 may have, in this manufacturing stage, a difference in height between the semiconductor region 303 and the isolation trench 312. In typical advanced applications, the active region 303 may exhibit an increased relative height 303H with respect to the isolation trench 312. This difference in height may negatively affect a corresponding lithography process for the formation of a contact opening above the semiconductor region 303, wherein a high probability for a misalignment of the respective contact opening may be observed, resulting in an increased shift of the contact opening towards the isolation trench 312.

Figure 3B:
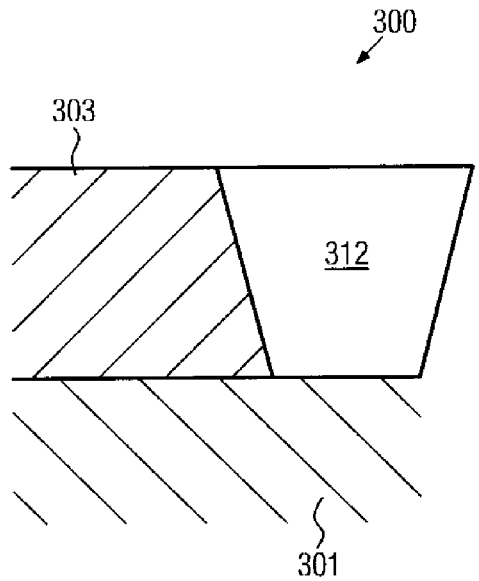
Figure 3C:
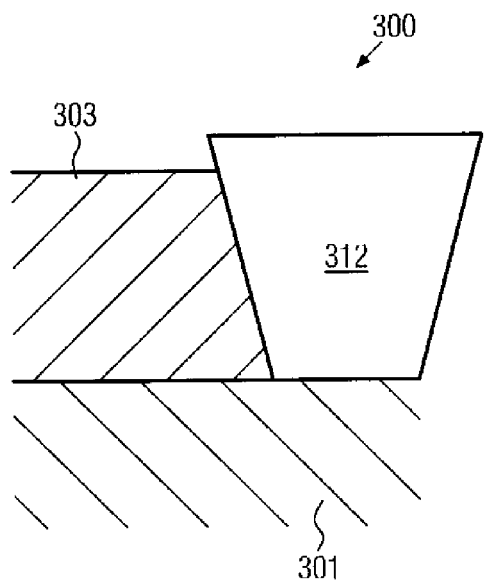

FIGS. 3b and 3c schematically illustrate more appropriate topographies for forming a respective interconnect structure over the semiconductor region 303 and the isolation trench 312, which may offer the potential for significantly reducing the probability of creating contact irregularities, such as the protrusion 111. While in FIG. 3b a substantially equal height level in the semiconductor region 303 and the isolation trench 312 is illustrated, FIG. 3c depicts an increased height at the isolation trench 312 to provide an enhanced probability of shifting a contact opening towards the semiconductor region 303. Consequently, the creation of any contact irregularities, such as the protrusions 111, during the further manufacturing processes may be reduced. Typically, the height difference between the semiconductor region 303 and the isolation trench 312, as illustrated in FIG. 3a, may be observed after the completion of any circuit elements and prior to a metal silicide processing, wherein any preceding cleaning and etch procedures may result in a respective recessing of the isolation trench 312. Consequently, in illustrative embodiments of the present invention, a corresponding process for reducing the relative height 303H of the semiconductor region 303 may be performed after any cleaning processes and prior to the formation of metal silicide regions in the semiconductor region 303.

Figure 3D:
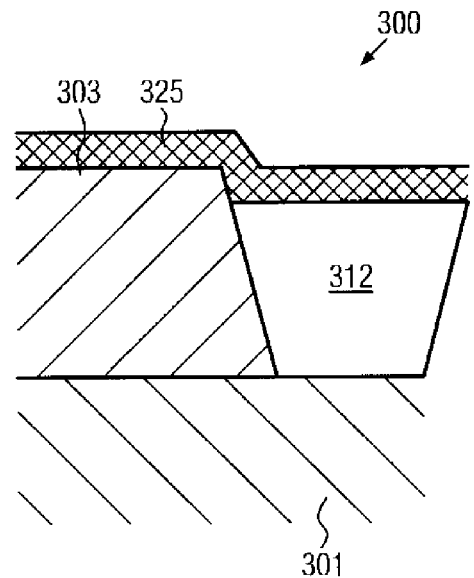

FIG. 3d schematically illustrates the semiconductor device 300 in an advanced manufacturing stage, in which an additional dielectric layer 325, such as a silicon dioxide layer, a silicon nitride layer and the like, may be formed above the semiconductor region 303 and the isolation trench 312. A thickness of the layer 325 may be selected so as to obtain a desired surface topography after removing a portion of the layer 325 located above the semiconductor region 303. For example, if a substantially equal height for the region 303 and the isolation trench 312 is desired, the thickness may substantially correspond to the height difference 303H (FIG. 3a). If an increased height of the isolation trench 312 with respect to the region 303 is desired, the layer 325 may be deposited with a respective excess thickness. The layer 325 may be formed on the basis of well-established deposition recipes.

Figure 3E:
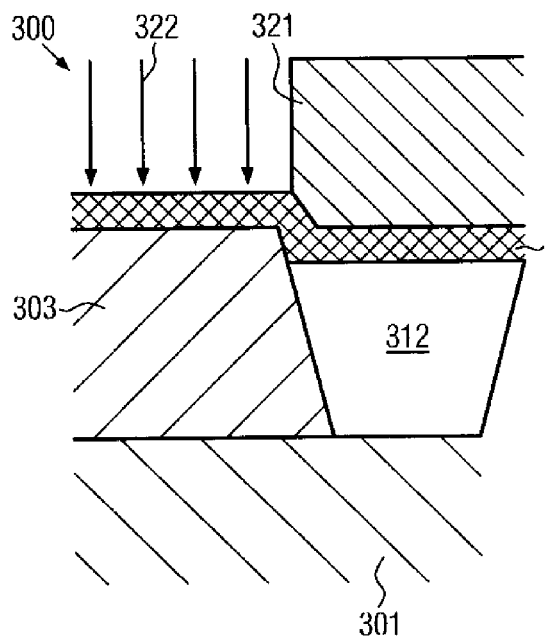

FIG. 3e schematically illustrates the device 300 in a further advanced manufacturing stage in which a resist mask 321 is formed above the isolation trench 312, thereby exposing the portion of the layer 325 located above the region 303 to an etch ambient 322. After the completion of the etch process 322, the resulting surface topography may have a configuration as is, for instance, shown in FIGS. 3b and 3c. In other illustrative embodiments, the layer 325 may be formed by oxidation, wherein material of the region 303 is consumed, while the isolation trench 312 may not be substantially affected by a corresponding oxidation process. Thereafter, the mask 321 may be formed and the device may be subjected to the etch process 322 to remove the oxidized portion in the region 303. Appropriate oxidation parameters may be readily established on the basis of well-known oxidation procedures for silicon dioxide. Thus, the amount of material removal in the region 303 may be controlled on the basis of an oxidation process, wherein the subsequent material removal of the oxidized portion may be accomplished on the basis of highly selective etch recipes, thereby providing enhanced process control.

Figure 3F:
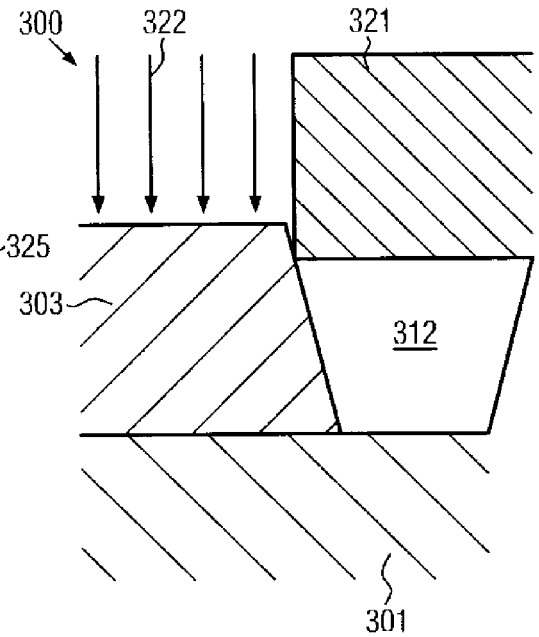

FIG. 3f schematically shows the semiconductor device 300 in accordance with still another illustrative embodiment in which an etch mask, such as a resist mask 321, is formed to cover the isolation trench 312 while exposing the semiconductor region 303 to the etch ambient 322 to remove material from the region 303. By controlling the etch time for a predetermined etch rate, the amount of removed material may be controlled to obtain the desired adaptation of the surface topography.

Figure 3G:
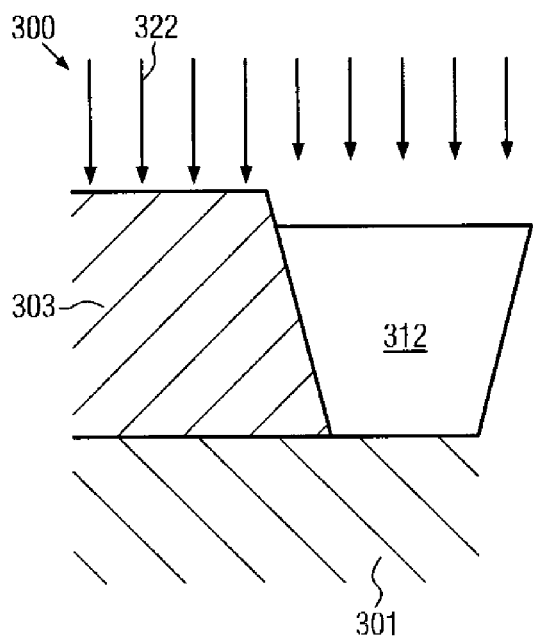

FIG. 3g schematically shows the semiconductor device 300 according to still another illustrative embodiment in which the etch ambient 322 is designed such that a certain degree of etch selectivity is obtained between the region 303 and the isolation trench 312. Thus, by establishing a high etch rate for the region 303, the desired adaptation of the surface topography may be accomplished. For example, a plasma-based etch procedure on the basis of hydrogen bromide (HBr) and chlorine may provide an enhanced etch rate for silicon while exhibiting a reduced etch rate for silicon dioxide. Also, in this case, a surface topography as is shown in FIGS. 3b and 3c may be obtained to enhance the lithography in a subsequent contact manufacturing process.

As a result, the present invention provides an enhanced technique for the formation of a contact region for a circuit element, wherein the effects of contact irregularities, such as metal-containing protrusions which may frequently form at an interface between an isolation trench and a respective drain and source region, may be significantly reduced and/or the probability for the formation of such irregularities may be significantly reduced. For this purpose, an additional doped region may be formed at least at an area in which a corresponding contact is expected to be formed, thereby reliably "embedding" corresponding contact irregularities within the doped region and reducing any leakage paths or reducing or avoiding the formation of a short circuit between a drain and source region and the surrounding well region. Additionally or alternatively, the surface topography prior to performing a contact lithography may be improved by reducing the relative height of the semiconductor region with respect to the adjacent isolation trench. For example, a substantially equal height level or an increased height of the isolation trench may be provided to reduce the probability for the creation of any contact irregularities.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming an active semiconductor region bordered by an isolation trench, said active semiconductor region defining a first PN junction and a second PN junction with a well region of said semiconductor region, said first PN junction defining a first junction depth, said second PN junction defining a second junction depth within a central area of said active semiconductor region;
   forming a third PN junction in said well region at a location proximate a contact region prior to forming the first and second PN junctions and prior to forming any contact opening adjacent to said active semiconductor region, said third PN junction having a third junction depth at said isolation trench, said third junction depth being greater than either of said first and second junction depths, wherein said third PN junction is formed by a doped region abutting said isolation trench, and wherein forming said active semiconductor region comprises performing a first implantation process for defining said first junction depth, a second implantation process for defining said second junction depth and a third implantation process for defining said third junction depth;
   providing a resist implantation mask covering at least said central region of said active semiconductor region and performing said third implantation process on the basis of said resist implantation mask, wherein said resist mask at least exposes a landing area for forming a contact plug on said contact region, and said landing area is selected to include at least a maximum allowed misalignment that may occur during the formation of said contact opening;
   forming a dielectric layer over said contact region;
   forming a contact opening in said dielectric layer to communicate with said contact region; and
   filling said contact opening with a conductive material.

2. The method of claim 1, further comprising forming a contact region in said active semiconductor region.

3. The method of claim 2, wherein said third ion implantation process is performed prior to forming said contact region.

4. The method of claim 3, further comprising forming said isolation trench and forming a gate electrode above said active semiconductor region, wherein said third ion implantation process is performed prior to forming said gate electrode.

5. The method of claim 4, wherein said third ion implantation process is performed prior to forming said isolation trench.

6. The method of claim 1, wherein said isolation trench has a recessed uppermost surface compared to an uppermost surface of said active semiconductor region, and the method further comprises:
reducing a relative height difference between a portion of said active semiconductor region located adjacent to said isolation trench and said recessed uppermost surface of said isolation trench.

7. The method of claim 6, wherein said relative height difference is reduced to provide an equal or higher height level of said isolation trench with respect to said portion.

8. The method of claim 6, wherein said relative height difference is reduced prior to forming said contact region.

9. The method of claim 8, wherein forming said contact region comprises performing a cleaning sequence and forming a metal silicide in said contact region, wherein said relative height difference reduction is performed after said cleaning sequence and prior to forming said metal silicide.

10. The method of claim 6, wherein reducing said relative height difference comprises forming a layer of insulating material above said portion and said isolation trench and selectively removing said insulating material from said portion.

11. The method of claim 10, wherein selectively removing said insulating material comprises forming an etch mask exposing said insulating material located above said portion and performing an etch process using said etch mask.

12. The method of claim 6, wherein reducing said relative height difference comprises selectively removing material from said portion by an etch process.

13. The method of claim 12, wherein selectively removing material from said portion comprises forming an etch mask covering said isolation trench and exposing said portion.

14. The method of claim 12, wherein selectively removing material from said portion comprises selecting an etch ambient having a higher etch rate for material of said portion compared to material of said isolation trench.

15. A method, comprising:
forming an isolation trench;
forming an active semiconductor region bordered by said isolation trench, said active semiconductor region defining a first PN junction and a second PN junction with a well region of said semiconductor region, said first PN junction defining a first junction depth, said second PN junction defining a second junction depth within a central area of said active semiconductor region;
forming a third PN junction in said well region at a location proximate a contact region prior to forming the first and second PN junctions, said third PN junction having a third junction depth at said isolation trench, said third junction depth being greater than either of said first and second junction depths, wherein forming said third PN junction comprises diffusing a dopant material from said isolation trench into said semiconductor region to define said third junction depth;
forming a dielectric layer over said contact region;
forming a contact opening in said dielectric layer to communicate with said contact region; and
filling said contact opening with a conductive material.

16. A method, comprising:
forming an isolation trench;
forming an active semiconductor region bordered by said isolation trench, said active semiconductor region defining a first PN junction and a second PN junction with a well region of said semiconductor region, said first PN junction defining a first junction depth, said second PN junction defining a second junction depth within a central area of said active semiconductor region;
forming a contact region in said active semiconductor region;
forming a third PN junction in said well region at a location proximate said contact region prior to forming the first and second PN junctions and prior to forming any contact opening adjacent to said active semiconductor region, wherein said third PN junction has a third junction depth at said isolation trench greater than either of said first and second junction depths, said third PN junction is formed by a doped region abutting said isolation trench, forming said active semiconductor region comprises performing a first implantation process for defining said first junction depth, a second implantation process for defining said second junction depth and a third implantation process for defining said third junction depth, and said third ion implantation process is performed prior to forming said contact region;
forming a gate electrode above said active semiconductor region, wherein said third ion implantation process is performed prior to forming said gate electrode;
forming a dielectric layer over said contact region;
forming a contact opening in said dielectric layer to communicate with said contact region; and
filling said contact opening with a conductive material.

17. The method of claim 16, further comprising providing an implantation mask covering at least said central region of said active semiconductor region and performing said third implantation process on the basis of said implantation mask.

18. The method of claim 17, wherein said implantation mask is provided as a resist mask, said resist mask at least exposing a landing area for forming a contact plug on said contact region, wherein said landing area is selected to include at least a maximum allowed misalignment that may occur during the formation of said contact opening.

19. The method of claim 16, wherein said third ion implantation process is performed prior to forming said isolation trench.

20. The method of claim 16, wherein said isolation trench has a recessed uppermost surface compared to an uppermost surface of said active semiconductor region, and the method further comprises reducing a relative height difference between a portion of said active semiconductor region located adjacent to said isolation trench and said recessed uppermost surface of said isolation trench.

21. The method of claim 20, wherein said relative height difference is reduced to provide an equal or higher height level of said isolation trench with respect to said portion.

22. The method of claim 20, wherein said relative height difference is reduced prior to forming said contact region.

23. The method of claim 22, wherein forming said contact region comprises performing a cleaning sequence and forming a metal silicide in said contact region, wherein said relative height difference reduction is performed after said cleaning sequence and prior to forming said metal silicide.

24. The method of claim 20, wherein reducing said relative height difference comprises forming a layer of insulating material above said portion and said isolation trench and selectively removing said insulating material from said portion.

25. The method of claim 24, wherein selectively removing said insulating material comprises forming an etch mask exposing said insulating material located above said portion and performing an etch process using said etch mask.

26. The method of claim 20, wherein reducing said relative height difference comprises selectively removing material from said portion by an etch process.

* * * * *